(12) United States Patent
Greenwood

(10) Patent No.: US 9,685,927 B2
(45) Date of Patent: Jun. 20, 2017

(54) GENETIC EQ-SETUP

(71) Applicant: Sennheiser electronic GmbH & Co. KG, Wedemark (DE)

(72) Inventor: Andrew Greenwood, San Francisco, CA (US)

(73) Assignee: Sennheiser electronic GmbH & Co. KG, Wedemark (DE)

( * ) Notice: Subject to any disclaimer, the term of this patent is extended or adjusted under 35 U.S.C. 154(b) by 94 days.

(21) Appl. No.: 14/590,425

(22) Filed: Jan. 6, 2015

(65) Prior Publication Data

US 2016/0197591 A1  Jul. 7, 2016

(51) Int. Cl.
H03G 5/00  (2006.01)
H03G 5/16  (2006.01)
H03G 9/00  (2006.01)

(52) U.S. Cl.
CPC .................. *H03G 5/165* (2013.01)

(58) Field of Classification Search
CPC ....................................... H03G 5/165
USPC ............................ 381/103, 101, 102; 700/94
See application file for complete search history.

(56) References Cited

U.S. PATENT DOCUMENTS

2011/0029111 A1* 2/2011 Sabin ................. H03G 5/165
700/94

* cited by examiner

*Primary Examiner* — Xu Mei
*Assistant Examiner* — Ammar Hamid
(74) *Attorney, Agent, or Firm* — Haug Partners LLP

(57) ABSTRACT

A method of adjusting an audio signal equalizer setting. A first and a second equalizer setting are selected from a population of equalizer settings for undergoing a binary comparing decision. The two equalizer settings are presented to a user by consecutively replaying an audio signal filtered by an equalizing unit according to the first or to the second equalizer setting respectively. The user's binary comparing decision between the first and the second equalizer setting according to his preferences is acquired. Further binary comparing decisions are performed until all members of the settings population have been part of a binary comparing decision. A score for the each presented equalizer settings is adapted based on the user's binary comparing decisions results. A weighted averaging is performed, based on the scores, in the frequency domain between the equalizer settings that received a high score, to obtain the result of the equalizer adjustment method.

10 Claims, 3 Drawing Sheets

GENETIC EQ-SETUP

FIELD OF THE INVENTION

The present invention relates to a method of adapting an equalizer setting for an audio signal to user's preferences.

It is noted that citation or identification of any document in this application is not an admission that such document is available as prior art to the present invention.

Different people have different preferences when it comes to listen to an audio signal, for example a music file. The use of equalizers enables the user to adapt the signal to his preferences by individually increasing or decreasing the signal's amplitude for different frequency bands. The equalizer therefor contains several bandpass filters and the amplitude for each frequency band provided by the equalizer can be adjusted separately. The equalizer setting consists of the amplitude values the user has chosen for the different frequency bands. Typically the user has to manually adjust the equalizer setting by separately adjusting the amplitude for each of those frequency bands. Alternatively, specific pre-settings of an equalizer for specific kinds of music like classic, pop, rock etc. are known. According to these settings, the parameters of an equalizer are adjusted and the input audio signal is processed accordingly to change the sound thereof.

It is noted that in this disclosure and particularly in the claims and/or paragraphs, terms such as "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the invention.

It is further noted that the invention does not intend to encompass within the scope of the invention any previously disclosed product, process of making the product or method of using the product, which meets the written description and enablement requirements of the USPTO (35 U.S.C. 112), such that applicant(s) reserve the right to disclaim, and hereby disclose a disclaimer of, any previously described product, method of making the product, or process of using the product.

SUMMARY OF THE INVENTION

It is an object of the invention to further adopt the sound of an audio signal to user's preferences.

This object is solved by the current inventive method of adapting an audio signal to user's preference.

The invention is based on the idea that instead of the user manually adjusting the equalizer setting, the equalizer setting can be adapted to the preferences of a user by a certain comparison procedure. According to the invention, the user can make a series of binary decisions between two different equalizer settings and the resulting equalizer setting is calculated e.g. based on a genetic algorithm. In other words, multiple binary decisions between different equalizer settings can be presented to the user who can choose which of the equalizer settings is preferable to him. Optionally, the user may also be able to manually modify each one of the presented equalizer settings, making this modified version the basis of the respective binary decision. Such a modification may have an increased weight and therefore, a stronger contribution to the resulting equalizing setting.

According to the invention, the final equalizer setting corresponds to the user's preferences.

For performing one of the binary decisions, an audio signal is received and a first and a second equalization based on a first and a second equalizer setting is performed on the audio signal. The two resulting equalized audio signals can be reproduced and the user can choose between the two equalized audio signals and determine which one he prefers. Optionally the user can furthermore declare that neither the first nor the second equalizer setting fits to his preferences. The user's answers are used for generating a score for each of the presented equalizer settings. A chosen equalizer setting receives a higher score and a not chosen equalizer setting receives a lower score.

Thereafter, the presented equalizer settings can be combined, for example by averaging and weighting to determine a new equalizer setting. The new equalizer setting can be applied to an input audio signal. This new equalizer setting can optionally be used as the final result of the comparison procedure or it can be used as additional equalizer setting to be used in further binary decisions in further steps of the comparison procedure.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

Figure 1:
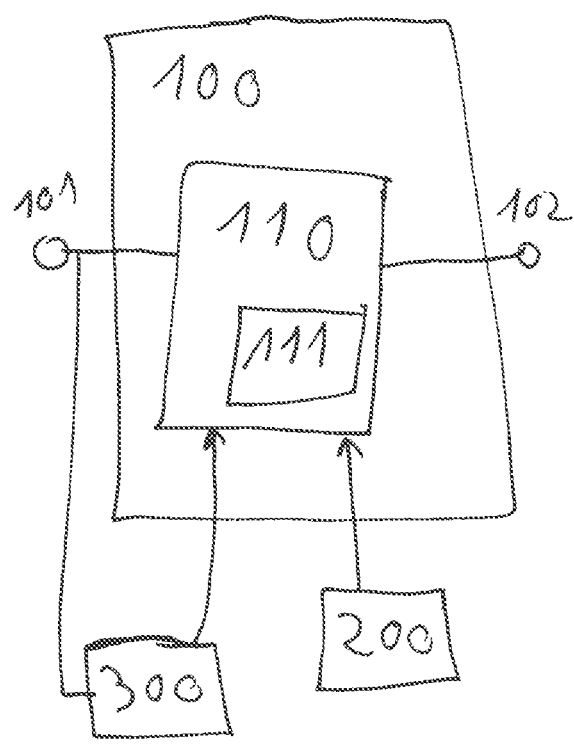
FIG. 1 shows a schematic representation of an audio processing unit according to the invention.

FIG. 1 shows a schematic representation of an audio processing unit according to the invention. The audio processing unit 100 comprises an input 101 and an output 102. The audio processing unit 100 furthermore comprises an equalizing unit 110. The equalizing unit 110 furthermore comprises an equalizing setting curve unit 111. Furthermore, an input unit 200 and an ID tag detecting unit 300 is provided. At its input 101, the audio processing unit 100 receives an audio signal AS and outputs at its output 102 a processed audio signal which is to be forwarded to a headphone or earphone.

Optionally an ID tag detecting unit 300 is coupled to the input 101 and determines whether the input audio signal AS comprises an ID tag. If the ID tag detecting unit 300 has detected an ID tag, this information is forwarded to the equalizing unit 110. Based on the detected ID tag of the input audio signal, the equalizing unit 110 can adapt the audio processing accordingly.

Figure 2:
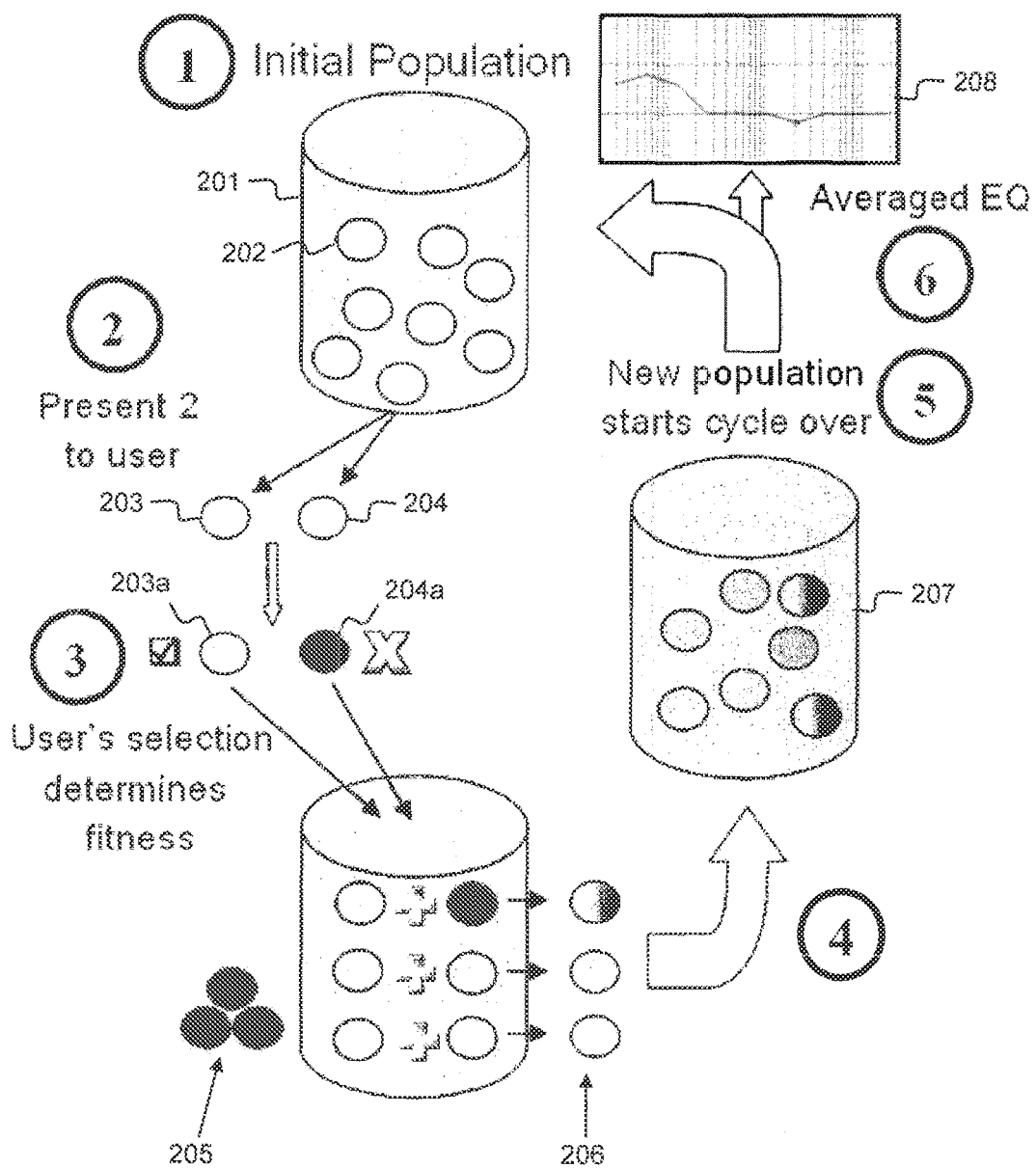
FIG. 2 shows a flow-chart of a genetic algorithm for determining the equalizer setting corresponding to the user's preferences according to the invention.

FIG. 2 shows a flow-chart of a genetic algorithm for determining the equalizer setting corresponding to the user's preferences according to the invention. An equalizer setting consists of a set of amplitude values, each amplitude value belonging to one of the different frequency bands supported by the equalizing unit 110.

In step 1 the iteration starts with a number of equalizer pre-settings. This number of equalizer pre-settings builds up an initial population 201 of different equalizer settings 202.

In step 2 an audio signal is playing and the user is presented with two equalizer setting choices 203 and 204 taken from the initial population 201. The user consecutively auditions the audio filtered through the two equalizer settings. Optionally the user furthermore has the option to modify either or both of the presented equalizer settings manually.

In step 3 the user then chooses which of those two equalizer setting sounds better according to his preferences and inputs his decision using the input unit 200. When a choice is made, the presented equalizer settings are scored. The presented equalizer setting 204a that is not chosen is given a low score and the presented equalizer setting 203a that is chosen is given a high score. If the user modifies the presented equalizer setting that is chosen, optionally that modified equalizer settings is given a higher score than if it is chosen unmodified.

This procedure is continued with pairs of two equalizer settings from the initial population 201 until all members of the population have been scored in those binary decisions. The equalizer settings 205, that hold a low score can optionally be removed from the population of equalizer settings.

In step 4 new equalizer settings 206 can be generated based on the scoring results. Optionally this can be done by combining two or more of the equalizer settings in the population that hold a higher score.

In step 5 the new equalizer settings 206 are appended to the remaining equalizer settings from the initial population, building up a new population 207. Optionally the decision procedure is iteratively repeated re-starting at step 2 based on this new population 207 instead of the initial population 201.

After several rounds of iterations, the population will consist of higher score equalizer settings that represent the user's preferences. In step 6 those higher score equalizer settings are combined to an averaged equalizer setting 208. This averaged equalizer setting 208 corresponds best to the preferences of the user and it represents the final result of the decision procedure.

Figure 3A:
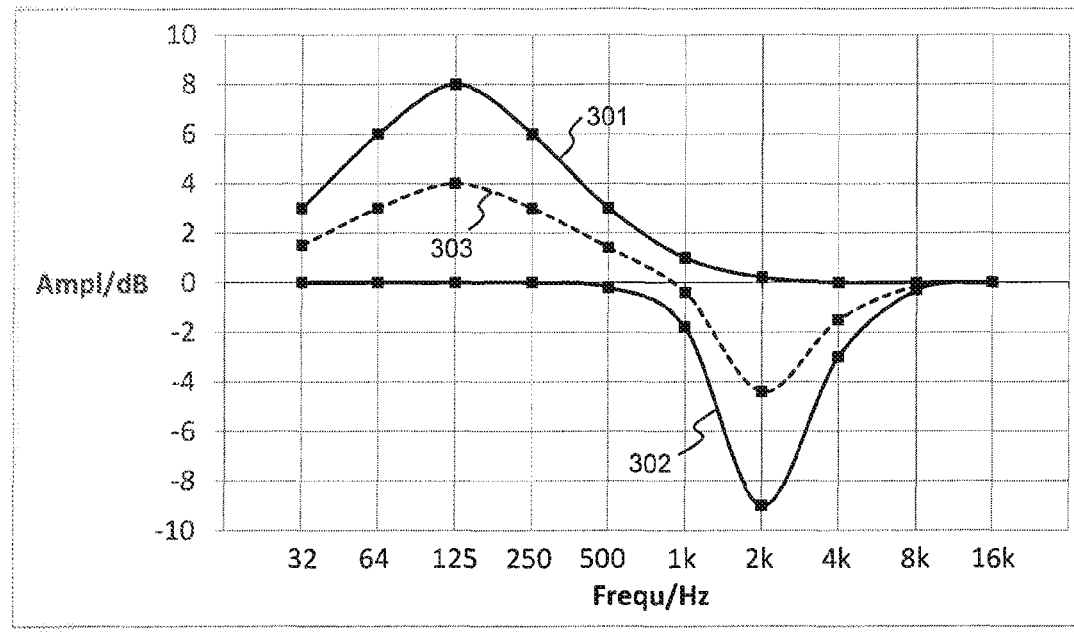
FIG. 3A shows an example for averaging between two equalizer settings in the frequency domain.

FIG. 3A shows an example for averaging between two equalizer settings in the frequency domain. In step 4, new equalizer settings 206 are generated by combining two or more equalizer settings. A method of combining two equalizer settings is illustrated in FIG. 3A. A first equalizer setting 301 and a second equalizer setting 302 are to be combined. The horizontal axis shows the frequency, exemplarily divided into ten frequency bands between 32 Hz and 16 kHz. The vertical axis represents the amplitude value in dB used for each of those frequency bands in an equalizer setting. One equalizer setting is defined by a set of those amplitude values, in this example by ten amplitude values.

The first equalizer setting 301 and a second equalizer setting 302 are combined, by adding each two of their amplitude values in dB together that belong to the same frequency band and divide the result by two. The result is an averaged equalizer setting 303 as shown in FIG. 3A.

Figure 3B:
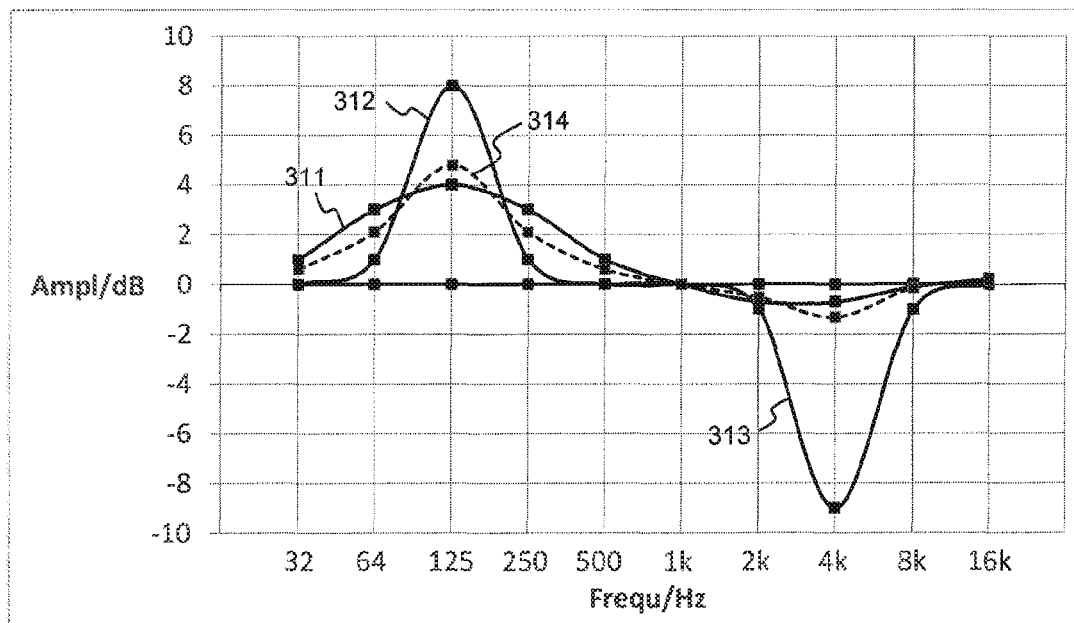
FIG. 3B shows an example for weighted averaging between three equalizer settings in the frequency domain, considering different scores belonging to the different equalizer settings.

FIG. 3B shows an example for weighted averaging between three equalizer settings in the frequency domain, considering different scores belonging to the different equalizer settings. A more elaborated way of averaging between a plurality of equalizer settings is illustrated in FIG. 3B. The equalizer settings 311, 312 and 313 are to be combined considering their scores. The basic process is the same as in FIG. 3A. The amplitude values in dB belonging to the same frequency band are summed together and afterwards divided. But in this case before adding up the amplitude values, each amplitude value in dB is multiplied by the score associated with its equalizer setting and the result of the summation is divided by the sum of all included equalizer setting's scores. In FIG. 3B the score of equalizer setting 311 is 6.0, the score of equalizer setting 312 is 3.0 and the score of equalizer setting 313 is 1.0. The result in this example is the equalizer setting 314.

The resulting equalizer setting 208 in step 6 of FIG. 2 is determined from the final population and the belonging scores according to this weighted averaging procedure.

The generation of new equalizer settings 206 in step 4 of FIG. 2 can also be done from subsets of the remaining population according to this weighted averaging procedure.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

The invention claimed is:

1. A method of adjusting an equalizer setting for an audio signal equalizer to a user's preference, the method being performed by an audio processing unit that comprises an equalizing unit and an input unit, the method comprising the steps of:

selecting a first and a second equalizer setting from a current population of equalizer settings for undergoing a binary comparing decision;

presenting the two equalizer settings to a user by consecutively replaying an audio signal filtered by an equalizing unit according to the first or to the second equalizer setting respectively;

acquiring the user's binary comparing decision between the first and the second equalizer setting according to his preferences via an input unit;

performing further binary comparing decisions with pairs of two further equalizer setting from the current population of equalizer settings until all members of the current population of equalizer settings have been part of a binary comparing decision;

adapting a score for each presented equalizer settings based on the user's binary comparing decisions results, wherein equalizer settings preferred by the user receive higher scores than equalizer settings not preferred by the user;

iterating the population according to the user's preferences by removing equalizer settings from the population that received a low score;

generating new members of the population based on the binary comparing decisions results and appending them to the remaining current population, whereby a new population is obtained;

iteratively re-performing the binary comparing procedure for the complete new population; and performing a weighted averaging in the frequency domain between the equalizer settings of the new population that received a high score, the weighting being based on the scores;

wherein the result of the averaging represents the result of the equalizer adjustment method.

2. The method of claim 1;

wherein each of the first and second equalizer settings comprises a plurality of amplitude values, each belonging to a frequency band, and the first and second equalizer settings differ in a plurality of amplitude values.

3. The method of claim 1;

wherein the user may manually modify an equalizer setting currently presented, and wherein the score that the manually modified equalizer setting receives is increased over a preferred score that is not manually modified.

4. The method of claim 1;

wherein the user's binary comparing decision between the first and the second equalizer setting may be that neither the first nor the second equalizer setting is preferable, and both the first and the second equalizer setting receive a low score.

5. The method of claim 1, further comprising steps of:

detecting that an input audio signal comprises an ID tag; and adjusting the equalizer setting according to the ID tag.

6. The method of claim 1;

wherein the step of generating new members of the population is based on a genetic algorithm that comprises:

selecting different equalizer settings of the current population; and combining selected equalizer settings of the current population to generate said new members of the population, wherein equalizer settings having a higher score have a higher probability of being selected than the equalizer settings having a lower score.

7. The method of claim 1;

wherein the step of generating new members of the population is based on a genetic algorithm that comprises:

selecting different equalizer settings that received a higher score; and combining the selected equalizer settings to generate said new members of the population.

8. An audio processing unit comprising:

an input unit; and an equalizing unit;

wherein the audio processing unit is adapted to perform the method of claim 1;

wherein the input unit is adapted to perform said step of acquiring the user's binary comparing decision between the first and the second equalizer setting; and wherein the equalizing unit is adapted to perform the remaining steps of claim 1.

9. The audio processing unit of claim 8, further comprising:

an ID tag detecting unit adapted for detecting whether an input audio signal comprises an ID tag, and further adapted for adapting the audio processing of the audio processing unit according to the ID tag.

10. An equalizer comprising:

a storage for storing a current population and members of a new population of equalization parameter settings;

an audio processing unit according to claim 8.

* * * * *